(12) United States Patent
Greer

(10) Patent No.: US 6,538,883 B1
(45) Date of Patent: Mar. 25, 2003

(54) METHOD AND APPARATUS FOR THERMALLY INSULATED AND EARTH COOLED ELECTRONIC COMPONENTS WITHIN AN ELECTRONIC SYSTEM

(75) Inventor: Stephen Greer, Santa Rosa, CA (US)

(73) Assignee: Turin Networks, Petaluma, CA (US)

( * ) Notice: Subject to any disclaimer, the term of this patent is extended or adjusted under 35 U.S.C. 154(b) by 0 days.

(21) Appl. No.: 09/957,153

(22) Filed: Sep. 19, 2001

(51) Int. Cl.[7] .................................................. H05K 7/20
(52) U.S. Cl. ........................ 361/687; 361/704; 165/16; 174/15.2
(58) Field of Search ................................. 361/687, 681, 361/688, 609, 697–699, 704; 165/16; 174/15.1–15.2, 16.1–16.2

(56) References Cited

U.S. PATENT DOCUMENTS 5,390,077 A * 2/1995 Paterson ..................... 361/700
6,115,250 A * 9/2000 Schmitt ...................... 361/695
2002/0105781 A1 * 8/2002 Ohashi et al. .............. 361/687

* cited by examiner

Primary Examiner—Darren Schuberg
Assistant Examiner—Hung Van Duong
(74) Attorney, Agent, or Firm—Blakely, Sokoloff, Taylor & Zafman LLP

(57) ABSTRACT

An electronic system is described having electronic components and an air flow channel that directs cooled air across the electronic components and directs warmed air into a heat exchanger. The electronic components and air flow channel are within a thermal insulating barrier. The heat exchanger converts the warmed air into the cooled air. The heat exchanger has an interface that couples to a ground loop that accepts warmed fluid from the heat exchanger and provides cooled fluid to the heat exchanger when the ground loop is at least partially located within the earth.

38 Claims, 3 Drawing Sheets

METHOD AND APPARATUS FOR THERMALLY INSULATED AND EARTH COOLED ELECTRONIC COMPONENTS WITHIN AN ELECTRONIC SYSTEM

FIELD OF INVENTION

The field of invention relates to packaging, generally; and, more specifically, to a method and apparatus for thermally insulated and earth cooled electronic components within an electronic system.

BACKGROUND

An electronic system is group of electronic components that are designed to work harmoniously as a collective whole; and, are housed within a mechanical package. Examples of electronic systems include networking systems (e.g., large scale or small scale routers, switches, wireless base stations, etc.) as well as computing systems (e.g., mainframes, workstations, servers, personal computers, etc.). An exemplary electronic system 130 is shown in FIG. 1.

Electronic components are typically mounted on cards (or "blades") which are plugged into a motherboard or backplane (e.g., via a card connector that is affixed to the motherboard or backplane). For example, as seen in FIG. 1, cards 102a through 102i are plugged into the surface 101 of a backplane or motherboard. Note that the number, shape, size, and positioning of the cards 102a through 102i and the backplane/motherboard 101 as seen in FIG. 1 are exemplary and may vary from embodiment to embodiment.

Frequently, each of the cards 102a through 102i are designed to perform a specific function that is consistent with the architecture and use of the system 130. For example, if the system 130 of FIG. 1 corresponds to a networking system, most of the individual cards 102a through 102i correspond to a networking adapter card which provides for one or more networking line connections to be made to the system 130. For example, card 102a may provide connections for 8 different Ethernet lines; card 102b may provide connections for 8 different T3 lines; card 102c may provide for 8 Synchronous Optical NETwork (SONET) lines, etc. Note that that the individual network lines are not drawn in FIG. 1 for simplicity.

During normal operation of the system 103, networking traffic (e.g., data, voice, etc.) received on a first networking line by a first card may be routed over the backplane or motherboard for transmission on a second line by a second card. For example, continuing with the exemplary networking system just described above, networking traffic that is received (within an Ethernet format) on a first line offered by card 102a may be routed over the backplane or motherboard to card 102c from where it is transmitted (within a SONET format) on a second networking line (that is offered by card 102c).

The backplane/motherboard 101 typically manages and/or transports the communications that transpire between the various cards 102a through 102i. The networking function of the system (e.g., the management and handling as to which networking line(s) the received traffic is re-transmitted from) is typically distributed amongst the various cards 102a through 102i, or handled within one or more cards dedicated to this function (e.g., a routing card that corresponds to card 102e), or designed upon the motherboard/backplane 101, or designed with some combination of these techniques.

With respect to computing systems, the motherboard/backplane 101 typically house one or more processor semiconductor chips that execute the system's software (although it is possible that computing machines may be constructed with processors distributed onto the cards 102a through 102i themselves) as well as manages or transports the communications that transpire between the various cards 102a through 102i. With respect to computing systems, cards 102a through 102i typically correspond to some combination of networking adapter cards (as discussed above), disk drives, memory expansions cards, video processing cards, etc.

Regardless if the system 130 is a networking, computing or other type of electronic system, however, the cards 102a through 102i and the motherboard or backplane 101 typically include electronic components such as integrated circuit (IC) semiconductor chips, discrete active devices (such as transistors) and discrete passive devices (such as capacitors, inductors, relays, transformers, etc.) that are cooperatively related according to an electronic circuit design. The electronic components on the cards 102a through 102i and the motherboard/backplane 101 are commonly surrounded by (and mounted to at various locations) a mechanical package 100 such as a metallic box-like or frame-like structure.

The electronic components, by the nature of their operation, are responsible for the consumption of electrical energy by the cards 102a through 102i and/or motherboard/backplane 101. The consumption of electronic energy results in the dissipation of heat. Electronic components are typically specified according to the temperature range of their surrounding environment (i.e. their "ambient"). That is, minimum and maximum ambient temperatures are defined between which the electronic components are expected to maintain proper operation.

As proper operation of a system depends upon maintaining the ambient temperature of its electronic components within their specified ranges, the thermal environment within the mechanical package 100 becomes an important part of a system's design.

FIGURES

The present invention is illustrated by way of example, and not limitation, in the Figures of the accompanying drawings in which.

DESCRIPTION

Figure 2:
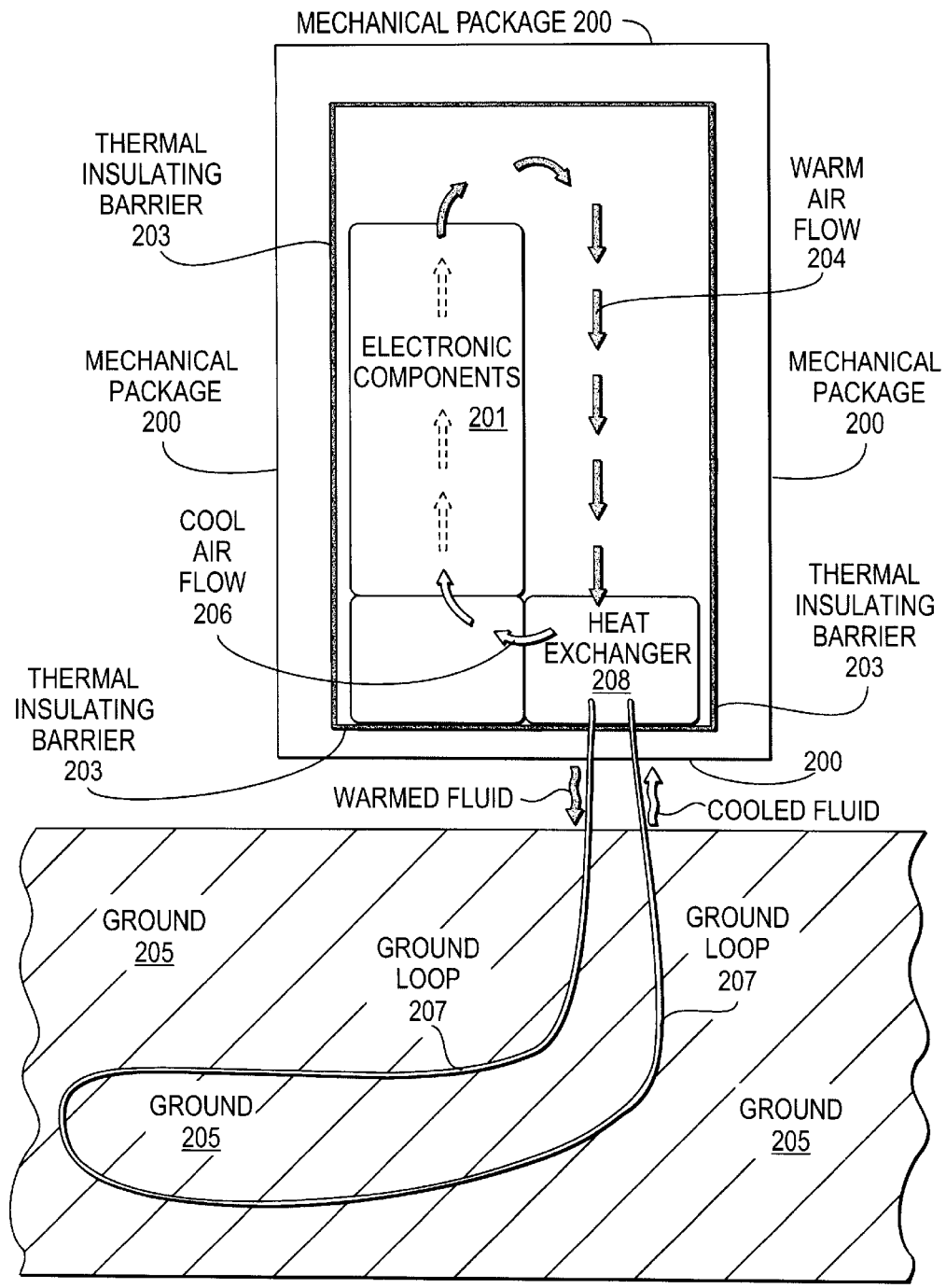
FIG. 2 shows an electronic system with improved thermal characteristics.

According to thermodynamic principles, the earth (depicted as ground 205 in FIG. 2) maintains a temperature within a range of approximately 12–18° C. (or approximately 55–65° F.) at depths of approximately 6 feet (note that these depths may vary as one approaches the equator or north or south poles). FIG. 2 shows an improved mechanical package for an electronic system that employs a ground loop 207 and a thermal insulating barrier 203.

According to the approach of FIG. 2, and as described in more detail below, the earth's constant temperature is used to control the ambient temperature around the electronic components 201 within the electronic system. The internal mechanical layout of the electronic system is designed as an air flow channel that controls the flow of air within the system. FIG. 2 depicts the air flow within the system (which includes warm air flow 204 and cool air flow 206) and thusly outlines the aforementioned air flow channel.

The ambient temperature of the system's electronic components 201 are controlled by continually cooling warm air 204 (that has been heated by the electronic components 201) with fluid that has been cooled by the earth. Effectively, the heat within the warm air flow 204 is transferred to the cooled fluid. The transfer of heat from air to fluid occurs within a heat exchanger 208. As heat is transferred by the heat exchanger 208 from the warm air flow 204 to the cooled fluid, the temperature of the cooled fluid rises. As such, the cooled fluid is converted into a warm fluid.

The warm fluid is then carried out of the system and into the ground 205 through a ground loop 207. The act of converting a warm air flow 204 into a warm fluid flow—and then carrying the warm fluid flow out of the system effectively removes the heat dissipated by the electronic components 201 from the system. This corresponds to the removal of energy from the system which, in turn, is reflected by the conversion (within the heat exchanger 208) of the warm air flow 204 into a cool air flow 206. That is, the temperature of the air flow drops as it passes through the heat exchanger 208.

The cool air flow 206 is then directed across the electronic components 201. The passing of the cool air flow 206 across the electronic components 201 transfers the heat that is generated by the electronic components 201 into the air flow (which warms the air flow thus converting the cool air flow 206 into a warm air flow 204). As the process continually repeats, the heat that is generated by the electronic components 201 is continually removed from the system. As such, the ambient temperature of the electronic components 201 can be kept within specified tolerances.

The warm fluid, after leaving the system, is run through a ground loop 207. The temperature of the warm fluid falls as it runs through the ground loop 207 because the heat associated with the warm fluid is absorbed by the earth 205. If the ground loop 207 has an appropriate length, the warm fluid is converted into a cool fluid by the time it returns to the heat exchanger 208. Thus, the heat generated by the electronic components 201 is continually absorbed by the earth 205 which allows their temperature to be kept within specified tolerances.

The ground loop 207 is a type of piping, embedded within the ground 205, that allows the transfer of heat from the fluid to the earth 205. The piping may be made of various materials that promote heat transfer and are suitable for the transfer of fluids. Some exemplary materials include various polyethylene substances among other possible materials not listed herein. The heat exchanger 208 typically has some form of interface that mates to the ground loop 207 (e.g., a pair of threaded or press-fit openings) so the ground loop 207 can be securely fastened to the heat exchanger 208.

For example, in various embodiments, the ground loop may be coupled to a nozzle that stems from a heat exchanger having a radiator-like structure (e.g., similar to that of an automobile). The nozzle receives fluid flow from the ground loop and directs the fluid through the radiator-like structure. Heat exchanger fans that are positioned to blow warmed air through the radiator-like structure effectively provide the heat exchanging activity. The fluid warms as it flows through the radiator-like structure and then flows out of the heat exchanger through a second nozzle. The ground loop, which is coupled to the second nozzle, receives the warmed fluid flow.

Note that the electronic system also has a thermal insulating barrier 203. The thermal insulating barrier 203 promotes the use of the earth 205 as a cooling source for the electronic components 201 (as described above) because it reduces the effect that the temperature(s) outside the thermal insulating barrier 203 will have upon the electronic components 201. As such, the thermal insulating barrier 203 may be viewed as any substance and/or structure that is designed to "block" (or substantially "block") the transfer of heat to/from the electronic components 201 from/to the environment that exists outside the electronic system.

For example, if the electronic system is placed in a warm or hot environment (e.g., by being placed in small room with other electronic systems that radiate thermal energy), the temperature of the electronic components 201 should not substantially rise (if at all) because the thermal insulating barrier 203 effectively "blocks" the transfer of heat from the warm or hot "outside" environment to the electronic components. As another example, if the electronic system is placed in a cold environment (e.g., by being placed at or near the earth's polar regions), the temperature of the electronic components 201 should not substantially fall (if at all) because the thermal insulating barrier 203 effectively "blocks" the transfer of heat from the electronic components 201 to the cold "outside" environment.

Furthermore, to the extent that a frigid environment is able to penetrate the thermal insulating barrier 203 and actually cool the electronic components 201 to a temperature that reaches or threatens to reach the lower bound of their ambient temperature specification, the heat exchanger 208 and ground loop 207 will "work in reverse". That is, the heat from the earth will warm the air flow passing through the heat exchanger so that the electronic components are warmed by the heat exchanging activity rather than cooled.

In a sense, the thermal insulating barrier 203, heat exchanger 208 and ground loop 207 may be viewed as a "common" thermal environment such that the region within the thermal insulating barrier 203 attempts to approach the temperature of the earth. As such, depending on how thermally penetrable the thermal insulating barrier 203 is (i.e., in those cases where the thermal insulating barrier 203 is designed to be or otherwise known to be less than ideal), the ground loop 207 and heat exchanger 208 may be designed with external thermal conditions in mind.

Regardless (referring back to an environment where the electronic components are to be warmed rather than cooled), more heat can be removed from within the thermal insulating barrier 203 as: 1) the length of the ground loop increases; and/or 2) the number of thermal loops that attach to the heat exchanger 208 are increased; and/or 3) the velocity of the air flow within the thermal insulating barrier 203 increases. Less heat can be removed from within the thermal insulating barrier by migrating in a direction that is opposite to those just cited above. Based upon the above considerations and the thermal penetrability of the thermal insulating barrier 203, those of ordinary skill will be able to tailor the thermal design of their electronic system in accordance with their particular application.

Note that an electronic component may be graded according to its thermal tolerance. For example, "industrial" grade specifications mandate that an electronic component maintains its electrical operating characteristics over a temperature range of −40 C. to +85 C.; and "commercial" grade specifications mandate that an electronic component maintains its electrical operating characteristics over a temperature range of 0 C. to +55 C.

Thus in various embodiments, the thermal environment within the thermal insulating barrier 203 may be designed to accommodate a recognized thermal grade. For example, in one embodiment, the environment within the thermal insulating barrier 203 is designed to maintain a temperature that falls within the "military" grade. In another embodiment, the environment within the thermal insulating barrier 203 is designed to maintain a temperature that falls within the "industry" grade.

In yet another embodiment, the environment within the thermal insulating barrier 203 is designed to maintain a temperature that falls within the "commercial" grade. The use of "commercial" grade electronic components may substantially reduce the cost of the electronic system (as compared to the cost of a system built with more expansive thermal tolerances). As such, any complexities that may arise from the implementation of an earth cooled system (as discussed herein) can be offset by the incorporation of less expensive electronic components.

Thus to review, the thermal insulating barrier 203 helps form a thermally isolated environment that uses the thermal stability of the earth 205 to control the temperature of the electronic components 201 within an electronic system. Note that the embodiment of FIG. 2 shows the thermal insulating barrier 203 as residing within the mechanical package 200 of the electronic system. Although not a strict requirement, designing the thermal insulating barrier 203 within the mechanical package 200 allows for the thermal insulating barrier 203 to be hidden from view (which may enhance any aesthetic qualities of the electronic system).

Figure 3:
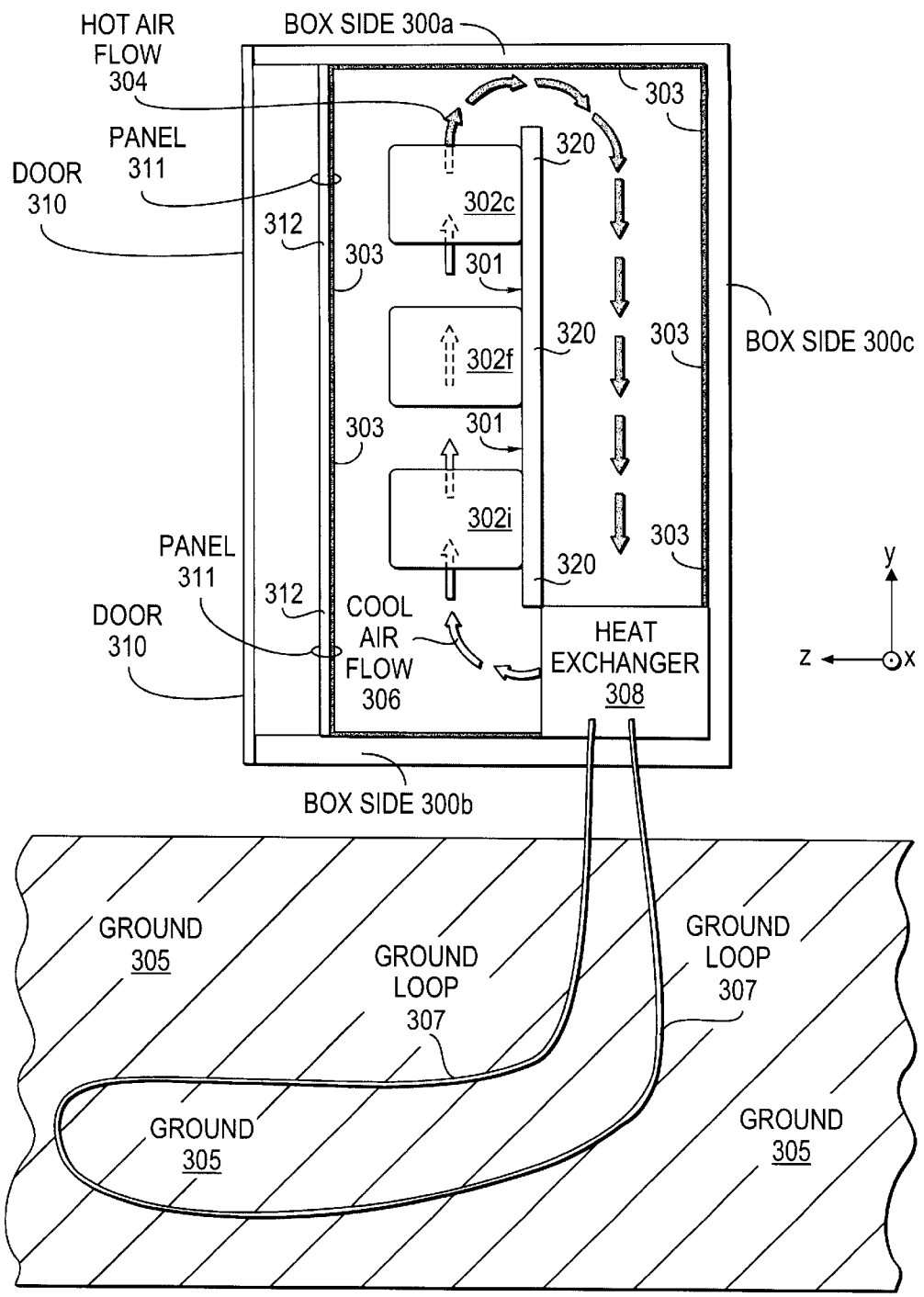
FIG. 3 shows an embodiment of the electronic system of FIG. 2.

FIG. 3 shows an embodiment of an electronic system that conforms to the approach discussed above with respect to FIG. 2 and implements the thermal insulating barrier 303 as a lining attached to the inner walls of the mechanical package. That is, as discussed in more detail below, the walls of the mechanical package are lined with a material 303 having thermal insulating properties.

Figure 1:
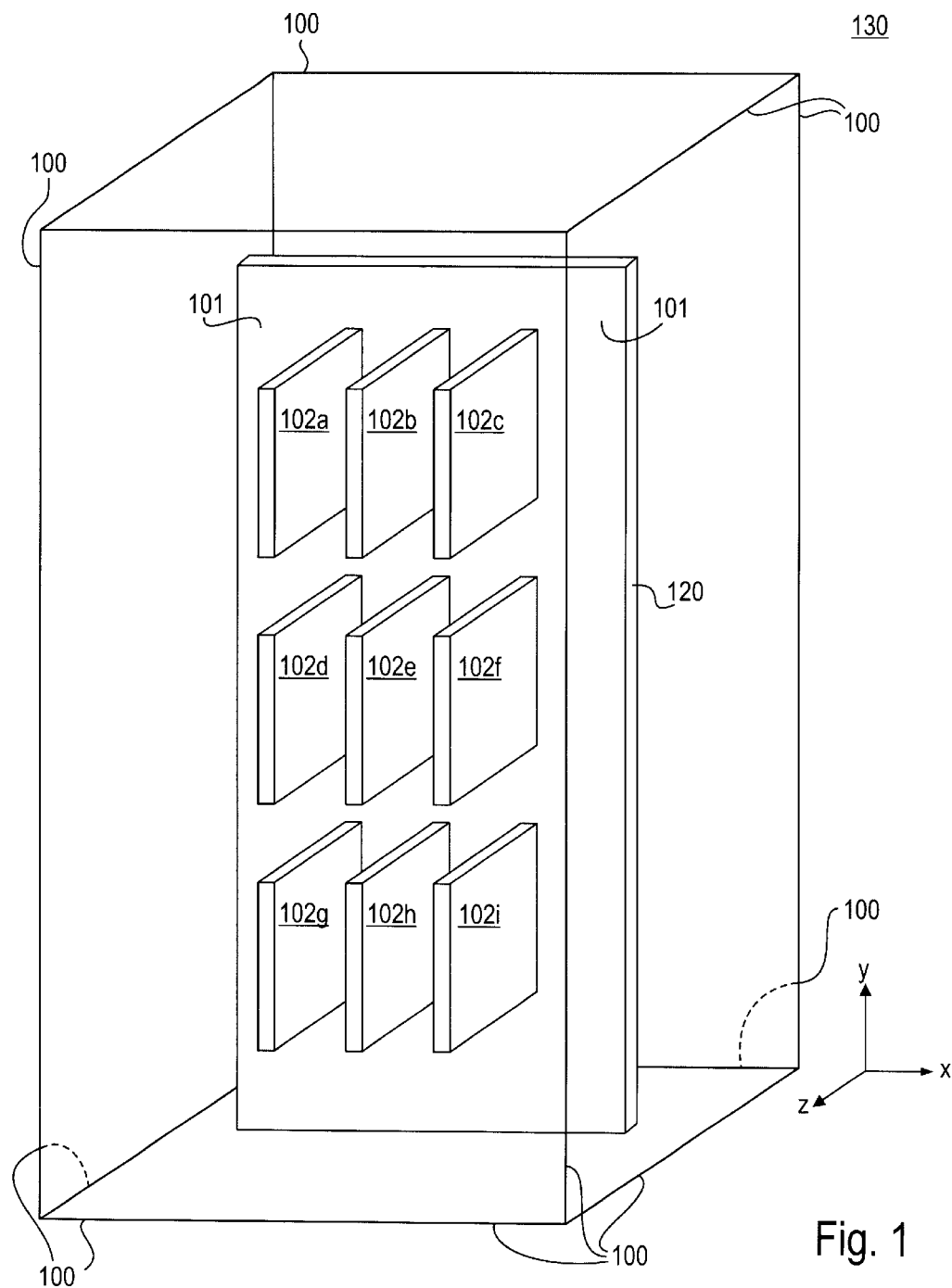
FIG. 1 shows an electronic system.

For simplicity, the electronic components in the embodiment of FIG. 3 are depicted as corresponding to the electronic system design originally shown in FIG. 1. That is, card 302c of FIG. 3 may be viewed as corresponding to card 102c of FIG. 1, card 302f of FIG. 3 may be viewed as corresponding to card 102f of FIG. 1, and card 302i of FIG. 3 may be viewed as corresponding to card 102i of FIG. 1. As such, motherboard/backplane edge 320 of FIG. 3 may be viewed as corresponding to motherboard/backplane edge 120 of FIG. 1 and motherboard/backplane surface 301 of FIG. 3 may be viewed as corresponding to motherboard/backplane surface 101 of FIG. 1.

The electronic components may be viewed as dispersed upon the various cards 302c, 302f and 302i that are observed in FIG. 3 (as well as dispersed upon cards deeper along the −x axis which are not observable in FIG. 3 because of its orientation). Electronic components may also be dispersed upon the motherboard/backplane surface 301. As seen in FIG. 3, a cool air flow 306 is formed by the heat exchanger 308 which then passes over the electronic components.

As the air flow passes over the electronic components, the air flow is converted into a warm air flow 304. The warm air flow 304 is then directed to the heat exchanger 308 for conversion back to a cool air flow 306. Note that the mechanical package for the electronic system may be viewed as five sided box with a door 310.

That is, a box is observed having a first pair of sides 300a, 300b that lie in the xz plane (which are observable at the "top" and "bottom" of the system in FIG. 3), a second pair of sides that lie in the yz plane (a first which corresponds to the "background" of the depiction of the system as seen in FIG. 3 and a second which has been "cut away" as drawn in FIG. 3 so that the inside of the box can be observed) and a fifth side 300c that lies in the xy plane (on the right of the system next to the warm air flow that flows in the −y direction as drawn in FIG. 3). The sides of these walls that face the electronic components are lined with a material 303 having thermal insulating properties.

That is, as seen in FIG. 3, box sides 300a, 300b and 300c have a lining 303 of thermal insulating material; and, the box sides that lie in the yz plane are also lined with a thermal insulating material. The thermal insulating lining on the walls of the box correspond to the formation of a portion of the thermal insulating barrier 303. The thermal insulating barrier 303 may also include the front panel of an adapter card that plugs into the system (such that the panel acts as a portion of the system's outer package). As described above, the thermal insulating barrier 303 may be comprised of material (such as plastic elastomers, Sol Gel, low density foam, Aerogel, fiberglass, and R-12 insulating (or better) material to name just a few) that prevents or thwarts the transfer of heat between the space encompassed by the barrier 303 and the space surrounding the barrier 303.

A door 310 that lies in the yx plane encloses the box to form the complete mechanical package. The door 310 may be coupled to the box in various ways such as with a hinge or by being designed to be securably attached to the box yet removable if desired. The door allows field service personnel access to the electronics (e.g., to plug in or pull out a card). That is, the door 310 is opened to gain access to the electronics and is closed (e.g., when the electronics do not need to be accessed) to form a mechanical package that encloses the electronics.

Note the placement of a panel 311 between the door 310 and the electronic components. The panel 311 helps form the air flow channel as well as the thermal insulating barrier 303. That is, the side of the panel 311 that faces the electronic components is also lined with a thermal insulating material. As such, the placement of the panel 311 between the door 310 and the electronic components (in light of the five lined box sides) forms a thermal insulating barrier 303 that encloses the electronics. The panel 311 may be one piece or multiple pieces.

The panel 311 also helps form part of the air flow channel. As discussed with respect to FIG. 2, the air flow channel is responsible for directing the flow of air from the heat exchanger 308 (as cool air), across the electronics and then back into the heat exchanger 308 (as warm air). As observed from the air flow shown in FIG. 3, cool air flow 306 is directed in the +y direction between the panel 311 and the motherboard/backplane surface 301.

This portion of the air flow channel effectively forces cool air to flow across the electronic components (which converts the cool air flow 306 to a warm air flow 304). The air flow channel then directs the air flow back into the heat exchanger 308 by forcing the air to flow in the −y direction between the motherboard/backplane and wall 300c. As such, similar to FIG. 2, the air flow currents drawn in FIG. 3 trace confines of the air flow channel that is built into the mechanical layout of the electronic system.

The heat exchanger 308 may be any of a number of different heat exchangers available on the market. Some examples include those manufactured by the McClean, Thermocore or Lytron corporations. In various embodiments, a heat exchanger from the 4000 or 6000 series product offerings of Lytron, Inc. have been identified (e.g., PN: 6340G2). The fluid that flows through the ground loop 307 may be pumped with a pump (not shown in FIG. 3 for simplicity) that is located along the ground loop (or within the heat exchanger 308). In an embodiment, the pump is battery operated so that the temperature within the thermal insulating barrier remains under control even if the electronic system suffers a power failure. In an alternate embodiment, the pump is designed to "switch over" to battery power if a power failure condition is detected.

Note that the panel 311 may be removed to deliberately create an opening in the thermal insulating barrier 303 that surrounds the electronics. Creating a large opening in the thermal insulating barrier may result in the loss of the earth's temperature as a means for cooling the electronic components. However, in many environments this may be acceptable (e.g., if a moderate temperature resides outside the electronic system).

As such (for example), at the discretion of field service personnel, the panel 311 may be secured to the box (to form a complete thermal insulating barrier 303) if extreme temperatures exist external to the system; and the panel 311 may be removed as the external temperatures become more moderate. Note that in the case of networking systems (and even computing systems), holes may be drilled into the panel 311 (and its thermal insulating lining) and the door 310 to allow the wiring associated with a networking line (e.g., a fiber optic cable or a shielded copper wire) to attach to a card and egress from the system. Note that as the diameter of these holes approach the diameter of their respective network lines (e.g., as the line becomes more squeezed by the hole it passes through), the thermal isolation provided by the thermal insulating barrier 303 will be better preserved.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
    an electronic system having electronic components and an air flow channel that directs cooled air across said electronic components and directs warmed air into a heat exchanger, said electronic components and air flow channel within a thermal insulating barrier, wherein said heat exchanger converts said warmed air into said cooled air, said heat exchanger having an interface that couples to a ground loop that accepts warmed fluid from said heat exchanger and provides cooled fluid to said heat exchanger when said ground loop is at least partially located within the earth.

2. The apparatus of claim 1 Wherein said electronic system is a networking system.

3. The apparatus of claim 1 wherein said electronic system is a computing system.

4. The apparatus of claim 1 wherein said fluid is pumped by a battery operated pump.

5. The apparatus of claim 1 wherein said electronic system further comprises a mechanical package that surrounds said thermal insulating barrier.

6. The apparatus of claim 1 wherein said thermal insulating barrier further comprises foam.

7. The apparatus of claim 1 wherein said thermal insulating barrier further comprises fiberglass.

8. The apparatus of claim 1 wherein said thermal insulating barrier further comprises an R-12 or better thermal insulating material.

9. The apparatus of claim 1 wherein at least one of said electronic components has a commercial grade thermal rating.

10. The apparatus of claim 2 wherein at least a portion of said electronic components are mounted on a networking adapter card.

11. The apparatus of claim 3 wherein at least a portion of said electronic components are mounted on a motherboard having a processor semiconductor chip.

12. The apparatus of claim 5 wherein said electronic system further comprises a panel placed between said electronic components and a door in said mechanical package, said panel having a thermal insulating lining that faces said electronic components so as to form a portion of said thermal insulating barrier.

13. The apparatus of claim 5 wherein said thermal insulating barrier is at least partially formed with a thermal insulating lining that is affixed to an inner wall of said mechanical package, said inner wall facing said electronic components.

14. The apparatus of claim 5 wherein said mechanical package further comprises a metallic box.

15. The apparatus of claim 5 wherein said mechanical package further comprises a plastic box.

16. An apparatus, comprising:
    an electronic system having electronic components and an air flow channel that directs cooled air across said electronic components and directs warmed air into a heat exchanger, said electronic components and air flow channel within a thermal insulating barrier, wherein said heat exchanger converts said warmed air into said cooled air, said heat exchanger coupled to a ground loop that accepts warmed fluid from said heat exchanger and provides cooled fluid to said heat exchanger, said ground loop located at least partially within the earth.

17. The apparatus of claim 16 wherein said electronic system is a networking system.

18. The apparatus of claim 16 wherein said electronic system is a computing system.

19. The apparatus of claim 16 wherein said fluid is pumped by a battery operated pump.

20. The apparatus of claim 16 wherein said electronic system further comprises a mechanical package that surrounds said thermal insulating barrier.

21. The apparatus of claim 16 wherein said thermal insulating barrier further comprises foam.

22. The apparatus of claim 16 wherein said thermal insulating barrier further comprises fiberglass.

23. The apparatus of claim 16 wherein said thermal insulating barrier further comprises an R-12 or better insulating material.

24. The apparatus of claim 16 wherein at least one of said electronic components has a commercial grade thermal rating.

25. The apparatus of claim 17 wherein at least a portion of said electronic components are mounted on a networking adapter card.

26. The apparatus of claim 18 wherein at least a portion of said electronic components are mounted on a motherboard having a processor semiconductor chip.

27. The apparatus of claim 20 wherein said electronic system further comprises a panel placed between said electronic components and a door in said mechanical package, said panel having a thermal insulating lining that faces said electronic components so as to form a portion of said thermal insulating barrier.

28. The apparatus of claim 20 wherein said thermal insulating barrier is at least partially formed with a thermal insulating lining that is affixed to an inner wall of said mechanical package, said inner wall facing said electronic components.

29. The apparatus of claim 20 wherein said mechanical package further comprises a metallic box.

30. The apparatus of claim 20 wherein said mechanical package further comprises a plastic box.

31. A method, comprising:
   converting a warm fluid flow into a cool fluid flow by running said warm fluid flow through a ground loop;
   converting a cool air flow into a warm air flow by running, within a thermal insulating barrier, said cool air flow across electronic components; and
   converting said cool fluid flow into said warm fluid flow by transferring heat from said warm air flow into said cool fluid flow.

32. The method of claim 31 further comprising pumping said fluid flows with a battery operated pump.

33. The method of claim 31 further comprising receiving networking traffic with at least a portion of said electronic components.

34. The method of claim 31 further comprising executing a software program with a processor that comprises a portion of said electronic components.

35. The method of claim 31 wherein the ambient temperature around said electronic components is within a commercial grade range.

36. An apparatus, comprising:
   an electronic system having electronic components and an air flow channel that directs a first air flow across said electronic components and directs a second air flow into a heat exchanger, said electronic components and air flow channel within a thermal insulating barrier, wherein said heat exchanger converts said second air flow into said first air flow, said heat exchanger having an interface that couples to a ground loop that accepts a first fluid from said heat exchanger and provides a second fluid to said heat exchanger when said ground loop is at least partially located within the earth.

37. The apparatus of claim 36 wherein said first air flow is a cooled air flow, said second air flow is a warmed air flow, said first fluid is a warmed fluid and said second fluid is a cooled fluid.

38. The apparatus of claim 36 wherein said first air flow is a warmed air flow, said second air flow is a cooled air flow, said first fluid is a cooled fluid and said second fluid is a warmed fluid.

* * * * *